United States Patent
Heiland

(10) Patent No.: US 7,859,259 B2
(45) Date of Patent: Dec. 28, 2010

(54) MAGNETIC FILED COMPENSATION SYSTEM WITH INCREASED BANDWIDTH

(75) Inventor: Peter Heiland, Raunheim (DE)

(73) Assignee: Integrated Dynamics Engineering GmbH (DE)

(*) Notice: Subject to any disclaimer, the term of this patent is extended or adjusted under 35 U.S.C. 154(b) by 733 days.

(21) Appl. No.: 11/770,948

(22) Filed: Jun. 29, 2007

(65) Prior Publication Data

US 2008/0012559 A1     Jan. 17, 2008

(30) Foreign Application Priority Data

Jul. 1, 2006     (EP)     .................... 06013699

(51) Int. Cl.
*G01R 33/04*     (2006.01)
(52) U.S. Cl. ...................... 324/253; 324/244
(58) Field of Classification Search .......... 324/253, 324/256–258
See application file for complete search history.

(56) References Cited

U.S. PATENT DOCUMENTS

| 4,843,877 | A  | * | 7/1989 | Kushida et al. | .......... | 73/514.08 |
| 2006/0109003 | A1 | * | 5/2006 | Redko et al. | ............... | 324/240 |

FOREIGN PATENT DOCUMENTS

| DE | 100 62 292 A1 | 3/2002 |
| JP | 8271598 A | 10/1996 |
| JP | 2001289893 A | 10/2001 |
| JP | 2004239828 A | 8/2004 |
| JP | 2004257904 A | 9/2004 |
| JP | 2005283191 A | 10/2005 |

OTHER PUBLICATIONS

Nakamura K., "Japanese Office Action for Application No. 2007-172716", Mar. 5, 2010, Publisher: Japanese Patent Office, Published in: JP.

Gutman J. L. et al., "Measurement Instrumentation for transient magnetic fields and currents", pp. 419-424, XP10557510, 2001 IEEE.

* cited by examiner

*Primary Examiner*—Bot L LeDynh
(74) *Attorney, Agent, or Firm*—DeMont & Breyer, LLC

(57) ABSTRACT

The invention relates to a device for compensating for magnetic fields which has two sensors which are active in different frequency ranges and thus allows regulation with a bandwidth from 0 to 20 kHz.

23 Claims, 4 Drawing Sheets

MAGNETIC FILED COMPENSATION SYSTEM WITH INCREASED BANDWIDTH

FIELD OF THE INVENTION

The invention relates to a device for measuring a magnetic field and to a device for compensating for magnetic fields. In addition, a method for compensating for magnetic fields is covered by the invention.

BACKGROUND TO THE INVENTION

Devices for measuring a magnetic field are known.

Modern sensors for measuring magnetic fields are frequently in the form of fluxgate magnetometers. By way of example, there are two-axis or three-axis fluxgate magnetic field sensors which can measure magnetic fields in all spatial directions. In this case, there are three respective coils on two ferromagnetic cores. A triangular waveform generator generates a current which flows through the excitation coils. The current sets up a magnetic field in the ferromagnetic cores. The change in the magnetic flow induces voltages in what are known as the pickup coils. When no external field is applied, the difference between the voltages in the pickup coils is zero. As soon as an external magnetic field is set up, a difference voltage is produced.

This difference voltage is used in a magnetic field compensation system in order to actuate compensating coils. The magnetic field from the compensating coils, which are typically in the form of Helmholtz coils in apparatuses for compensating for magnetic fields, compensates for the external magnetic field.

Such fluxgate sensors are distinguished by high sensitivity and high resolution.

A drawback of apparatuses for compensating for magnetic fields with a fluxgate sensor is that the sensors normally have a very small bandwidth. Thus, the sensor bandwidth usually does not extend beyond 2 kHz.

Alternatively, the sensor used for measuring the magnetic field can also be a coil and the voltage induced in the coil by an external magnetic field can be measured. Such coil sensors are particularly suitable for relatively high frequencies, that is to say magnetic alternating fields, and are, by contrast, usually unsuitable for frequencies below 10 Hz. In addition, the signal from a coil sensor of this kind can be integrated into a digital signal processing system only very poorly. The high frequency of the measured alternating fields means that it would be necessary to provide a digital signal processing system having an extremely high sample frequency, which is complex and in many cases impossible.

OBJECT OF THE INVENTION

By contrast, the invention is based on the object of providing a device for measuring a magnetic field which has a large bandwidth.

In particular, it is an object of the invention to provide a device for measuring magnetic fields which is actually suitable for magnetic fields having a very low alternating frequency or even having a frequency of almost 0 Hz.

It is another object of the invention to provide a device for measuring a magnetic field and also a device for compensating for a magnetic field which allow digital actuation and at the same time are also suitable for magnetic alternating fields of relatively high frequency, particularly also for alternating fields above 2 kHz.

It is a further object of the invention to provide a particularly compact sensor system for measuring magnetic fields; in particular, the entire sensor system needs to be able to be integrated in one housing.

SUMMARY OF THE INVENTION

The object of the invention is achieved merely by a device for measuring a magnetic field, a device for compensating for magnetic fields and by a method for compensating for magnetic fields.

Accordingly, a device for measuring a magnetic field is provided which comprises a first sensor and a second sensor. The first sensor is active for magnetic fields in a first frequency range, whose frequency range covers lower frequencies than the frequency range in which the second sensor is active.

By coupling such sensors which are active in various frequency ranges, it is possible to provide a device for measuring a magnetic field which has an extraordinarily large bandwidth.

In one preferred embodiment of the invention, the bandwidth of the device for measuring the magnetic field extends from 5 Hz to 1 kHz, preferably from 2 Hz to 10 Hz, particularly preferably from 0.1 Hz to 20 kHz. Hence, devices for measuring magnetic fields are produced which are active from a frequency equal to or almost 0 up to alternating frequencies of the magnetic field of 20 kHz.

Preferably, the first frequency range is below 15 kHz, preferably below 7 kHz and particularly preferably below 3 kHz; at the same time, the first frequency range starts below 1 Hz, preferably below 0.5 Hz and particularly preferably at 0 Hz.

The second frequency range is above 5 Hz, preferably above 15 Hz and particularly preferably above 20 Hz and extends at least up to 10 kHz, preferably up to 15 kHz and particularly preferably up to at least 20 kHz.

In one development of the invention, the device for measuring the magnetic field has means for digitally processing the signal from the first sensor and means for analog processing of the second signal from the second sensor.

Digital processing of the sensor signals from the first sensor can be used to achieve an easy actuation of the device for measuring the magnetic field, in particular, for example using a computer. Preferably, the signal from the second sensor is subjected to analog processing, for example is forwarded to an analog amplifier. Thus, no digital signal processing with a large bandwidth is required, and overall it is possible to achieve larger bandwidths for the device for measuring the magnetic field.

The analog processing of the signal from the second sensor does not preclude the digital processing of the signal from the first sensor from being able to be used to influence the analog processing, for example a digital control and/or regulating unit from being able to control and/or regulate the gain factor of an amplifier arranged within the analog control loop.

In one preferred embodiment of the invention, the axes in which the sensors are active are essentially parallel. Preferably, the axes are situated essentially upon one another. Accord between the axes means that the sensors measure in the same direction. The effect achieved by this is that the signals from the two sensors merge into one another smoothly during appropriate signal conditioning.

If possible, the sensors are situated close together, particularly at a distance of less than 10 cm, preferably less than 2 cm.

In one development of the invention, the device for measuring a magnetic field has a low-pass filter for the signal from the first sensor. The low-pass filter is used to cut high frequency components and thus to limit the bandwidth of the sensor. At the same time, the device for measuring a magnetic field has a high-pass filter for the signal from the second sensor, the high-pass filter being used to cut the low frequency components of the second sensor.

The effect achieved through simultaneous use of a high-pass filter and a low-pass filter is that there is no frequency range within which the sensor signals overlap. The cutoff frequency at which there is a transition from one sensor to the other is preferably between 15 and 50 Hz.

Magnetic fields having a low alternating frequency are preferably measured using a fluxgate sensor. Such fluxgate sensors are distinguished in that they respond even to pure DC fields (0 Hz), are very sensitive and have a high level of accuracy.

The second sensor used may be a coil where the voltage induced in the coil is measured.

To keep crosstalk between the two sensors as low as possible, the fluxgate sensor in one development of the invention is operated at a chopper frequency which is at least twice, preferably at least three times and particularly preferably at least five times as high as the upper end of the bandwidth within which the device for measuring the magnetic field is active. Chopper frequency is understood to mean the frequency at which the excitation coils of the fluxgate sensor are operated. Operating the fluxgate sensor at a frequency which is a long way above the bandwidth in which the device for measuring a magnetic field is active minimizes crosstalk between the sensors.

The chopper frequency is above 50 kHz, preferably above 80 kHz and particularly preferably above 120 kHz.

To minimize the crosstalk further, the sensors are fitted such that magnetic field emissions coming from the sensors point essentially away from the respective other sensor as far as possible.

It is thus possible to arrange both sensors in one housing and in this way to provide a hybrid sensor which has a bandwidth from 0 to 20 kHz.

In the housing or in a downstream processing device, the sensor signals can be brought together in an adder. Arranged upstream of the adder are preferably a high-pass filter and a low-pass filter, so that the adder essentially has the function of connecting the sensor signals to a line.

The invention also relates to a device for compensating for magnetic fields which comprises a device for measuring a magnetic field and at least one compensating coil.

The compensating coils are typically in the form of Helmholtz coils. Preferably, three Helmholtz coils which are essentially at right angles to one another are used, so that compensation for magnetic fields is possible in all three spatial directions.

In one development of the invention, the device for compensating for magnetic fields comprises at least one digital signal processor. The digital signal processor is preferably connected to the first sensor via an analog/digital converter. Thus, the signal from the first sensor is processed further in the digital signal processor. In particular, the signal can be amplified or a digital low-pass filter can be formed by the digital signal processor.

The digital signal processor preferably has an interface for connecting a PC, for example, said interface being able to be used to control and/or regulate the device for compensating for magnetic fields.

A digital/analog converter can then be used to forward the sensor signal at the output of the digital signal processor, said sensor signal being able to be used as a signal for operating the compensating coils.

To be able to use the digital signal processor to control the analog control loop too, which is preferably comprised of the second sensor, the digital signal processor in one development of the invention is connected to the gain of an amplifier. The gain can be used to control and/or regulate the gain factor of the analog signal loop.

In addition, the digital signal processor may also be connected to further components of the analog control loop, either in order to take account of signals from the analog control loop in the control or regulation, in order to indicate the signals and/or in order to actively influence the analog control loop. In particular, the digital signal processor can also receive and evaluate signals from the second sensor or may be connected to a further amplifier which, as a terminating amplifier, amplifies the compensating signals for the Helmholtz coils.

Finally, the invention relates to a method for compensating for magnetic fields, where the magnetic field is detected in a first frequency range by means of a first sensor and is detected by means of a second sensor in a second frequency range, at least sections of the second frequency range being above the first frequency range. The sensor signals are at least amplified and the amplified and possibly adapted and processed sensor signals are used to actuate at least one compensating coil.

Preferably, the signals from the first sensor are processed in a digital control path and the signals from the second sensor are processed in an analog control path.

Thus, a method is provided which allows magnetic fields to be compensated for with an extremely high bandwidth. At the same time, digital control or regulation is possible without the need to provide a digital controller having a high sample frequency.

BRIEF DESCRIPTION OF THE DRAWINGS

The invention will be explained in more detail below with reference to the drawings in FIG. 1 to FIG. 5.

DETAILED DESCRIPTION

Figure 1:
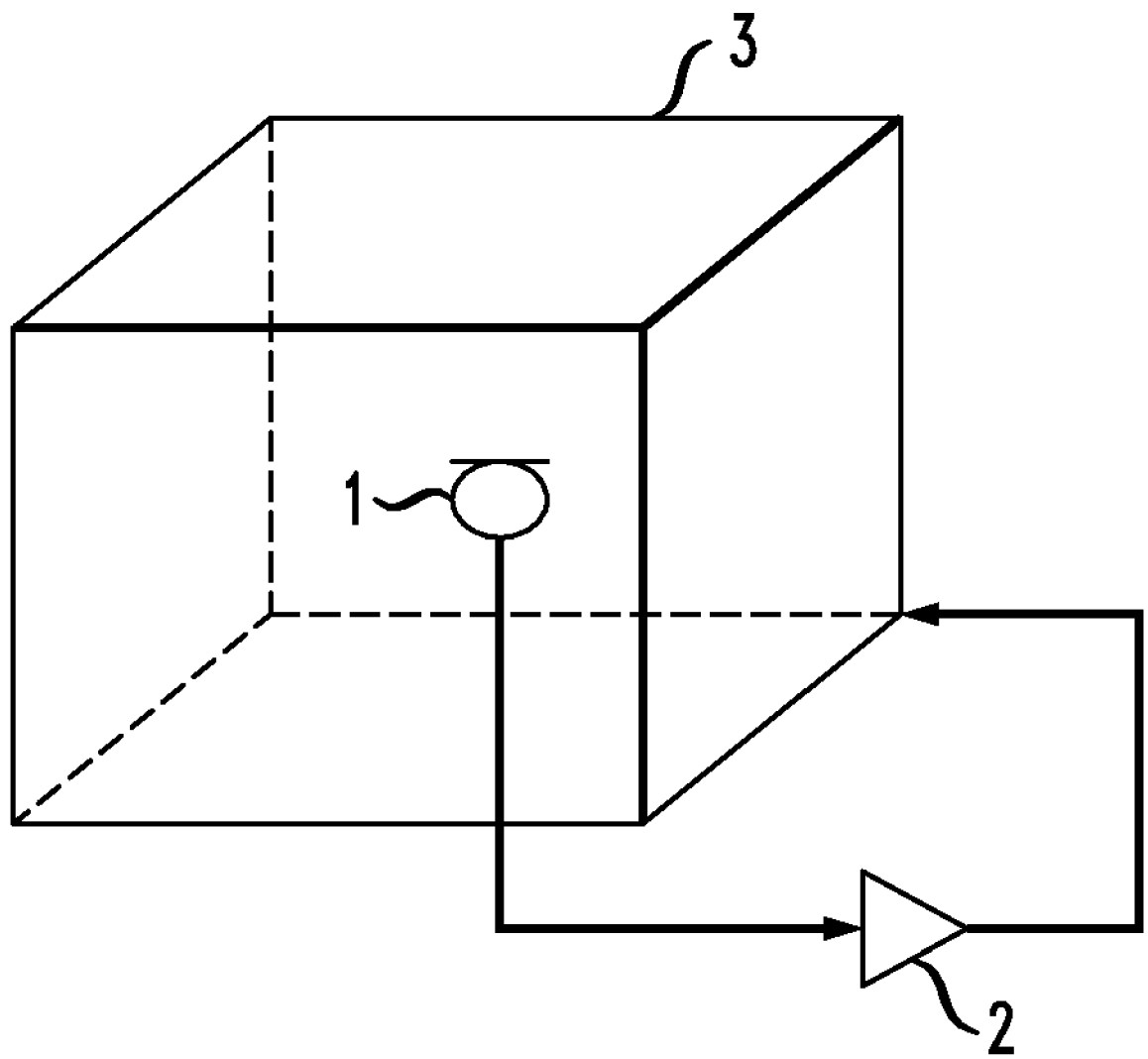
FIG. 1 schematically shows the principle of compensation for magnetic fields.

The principle of compensation for magnetic fields will be explained with reference to FIG. 1. A sensor 1, which is preferably active in all three spatial directions, is used to measure the magnetic field. The sensor 1 is connected to Helmholtz coils 3 via a control path within which an amplifier 2 is used to amplify the sensor signal and to actuate three Helmholtz coils 3 arranged at right angles to one another. The Helmholtz coils 3 are used to produce a compensating field and ideally to regulate the entire magnetic field at the location of the sensor 1 to 0.

In compensating for the magnetic fields, the sensor plays the most important role. The interference fields can assume frequencies starting from a pure DC field (0 Hz) up to a few kHz. The sensor should therefore be able to detect interference fields over a wide bandwidth. At the same time, the control path via which the sensor is coupled must be able to process both low-frequency and high-frequency signal components and to generate compensating signals therefrom.

Figure 2:
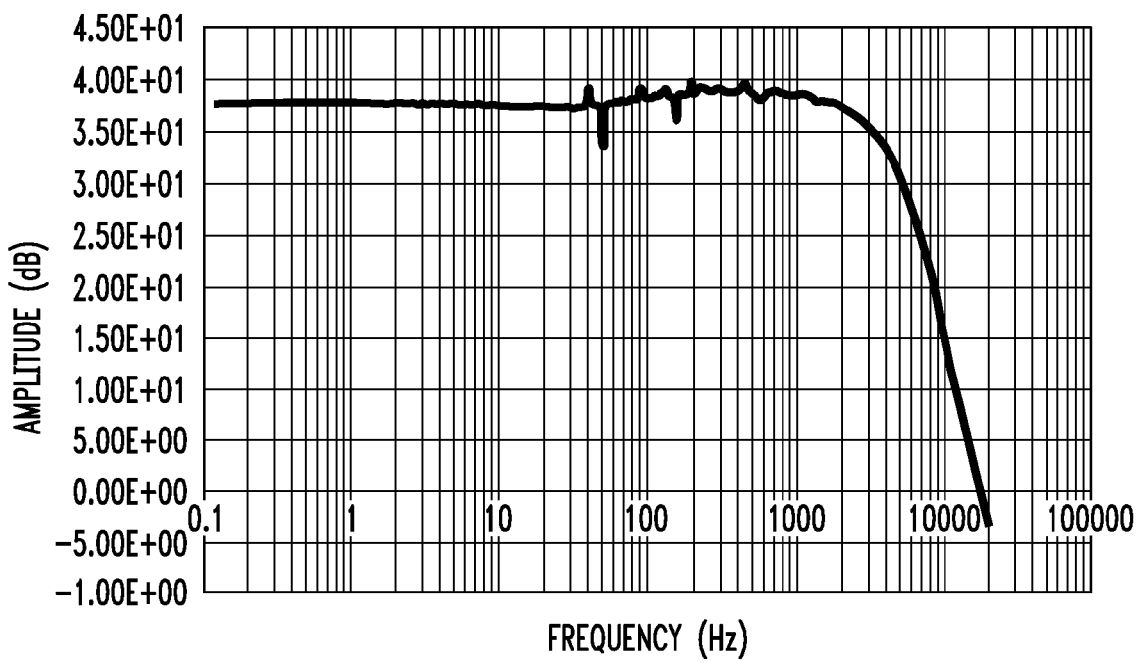
FIG. 2 shows the characteristic curve for a fluxgate sensor.

FIG. 2 shows a characteristic curve for a fluxgate sensor. The frequency of the magnetic field in Hz is plotted on the X axis and the signal amplitude of the sensor is plotted on the Y axis. As can be seen from the curve, the fluxgate sensor responds even to fields of almost 0 Hz. At approximately 2 kHz, the signal from the sensor drops off sharply. A sensor of this kind is therefore able to determine alternating fields up to a maximum of 2 kHz. The sensor is distinguished by high sensitivity and high accuracy.

Figure 3:
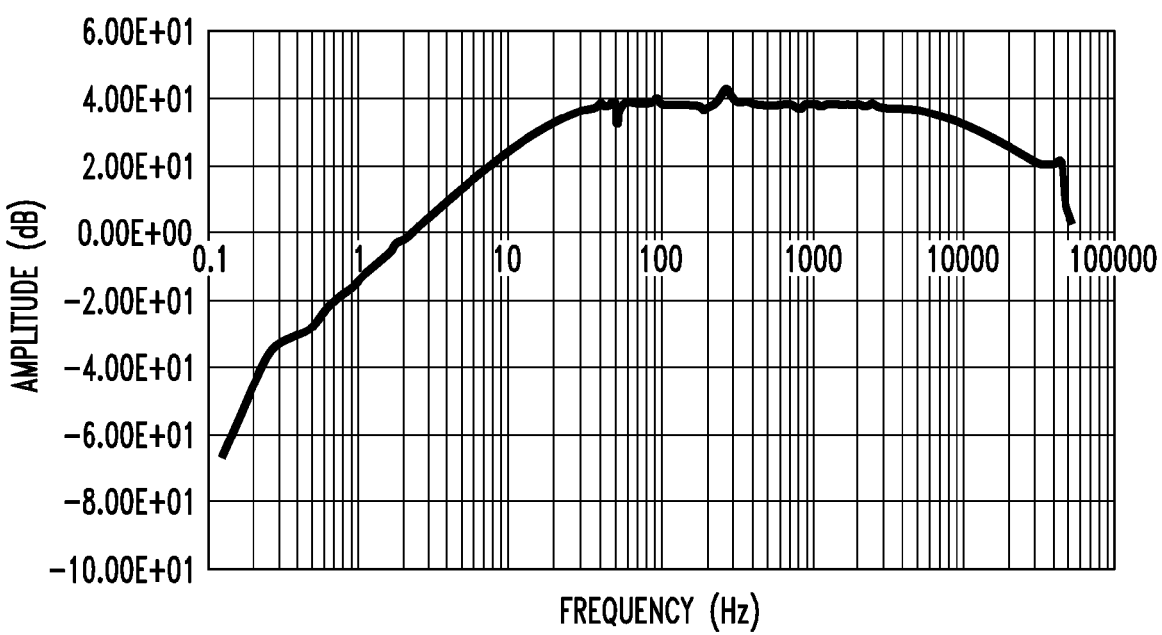
FIG. 3 shows the characteristic curve for a coil.

FIG. 3 shows the characteristic curve for a sensor which is in the form of an induction coil. With this kind of sensor, a signal which allows accurate determination of the magnetic field is not present until after approximately 20 Hz. Below 20 Hz, the sensor signal is so weak that it cannot be used for compensating for magnetic fields, or can be used to do so only inadequately.

Figure 4:
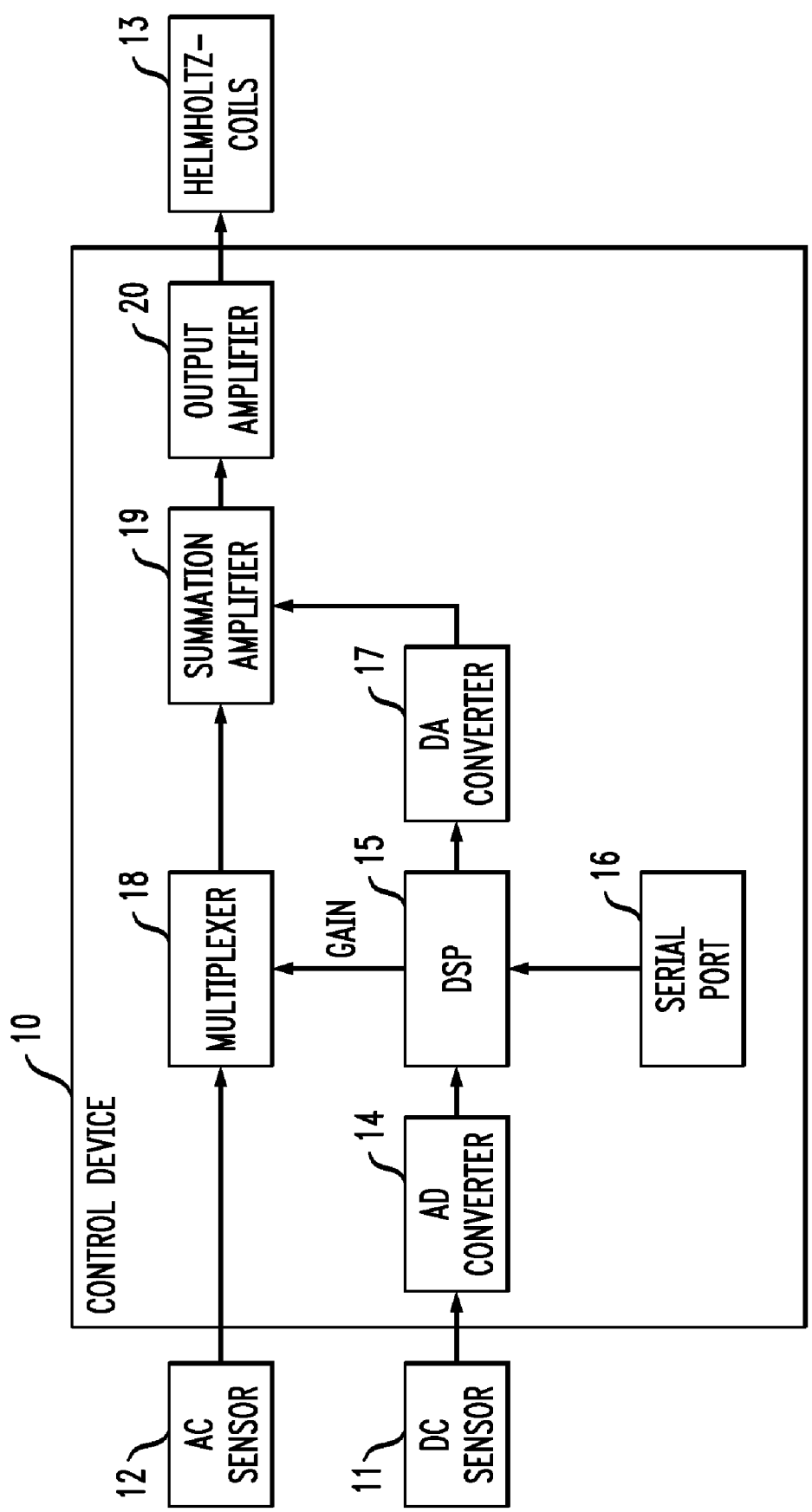
FIG. 4 schematically shows the component parts of an exemplary embodiment of a system for compensating for magnetic fields, FIG. 5 schematically shows the method steps of an exemplary embodiment of compensation for magnetic fields.

The fundamental constituents of an exemplary embodiment of a device for compensating for magnetic fields 10 will be explained in more detail with reference to FIG. 4.

The device for compensating for magnetic fields 10 comprises two sensors, a first sensor 11 which is in the form of a fluxgate sensor and detects low-frequency frequency components, particularly in the range from 0 to 20 Hz. Such a sensor is also called a DC sensor, even if it is designed to detect magnetic fields above 0 Hz. To detect relatively high-frequency magnetic fields, particularly magnetic field components above 20 Hz, the device for compensating for magnetic fields 12 comprises a second sensor 12 which is in the form of an induction coil. This is also called an AC sensor.

To a certain degree, the core of the device for compensating for magnetic fields 10 is formed by a digital signal processor 15 which is used to form a digital control path for processing the signal from the first sensor 11. The digital signal processor can be connected to a personal computer (not shown) via a serial interface 16.

To be able to process the signals from the first sensor 11, they are forwarded to the digital signal processor 15 via an analog/digital converter 14. In this exemplary embodiment, the digital signal processor 15 filters out frequency components above 20 Hz and thus forms a digital low-pass filter. The serial interface 16 can be used to set the cutoff frequency of the digital low-pass filter. The signal from the first sensor 11 can also be amplified and the gain factor can likewise be set using the serial interface 16. The processed signal is forwarded to a digital/analog converter 17.

The second sensor 12 is connected to a multiplexer 18, which in this exemplary embodiment is used essentially as an amplifier. The gain of the multiplexer 18 is connected to the digital signal processor 15. Thus, the gain factor for the signal from the second sensor 12 can likewise be set. Upstream of the multiplexer 18, there is also a high-pass filter which filters out frequency components below 20 Hz (not shown). The signals from the second sensor 12 do not pass through the digital control path but rather are forwarded to an adder 19, which is likewise connected to the digital/analog converter 17, in analog form.

The adder 19 connects the signals to a line and finally forwards them to a further amplifier 20 which is used to amplify the compensating signal for the Helmholtz coils 13 for the purpose of compensating for magnetic fields.

The system for compensating for magnetic fields 10 which is shown here has a control bandwidth of 0 to 20 kHz.

Figure 5:
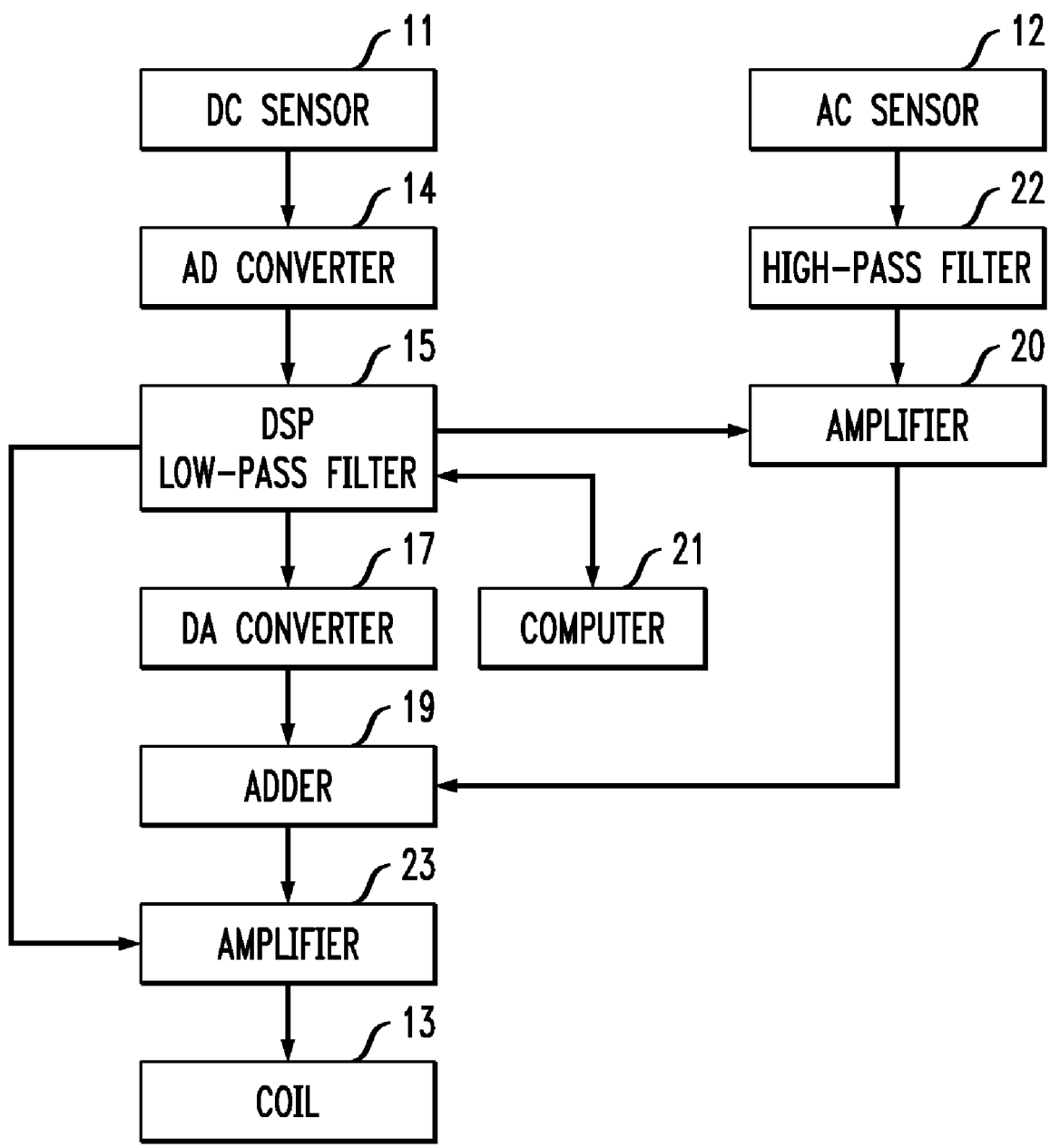

The fundamental method steps of an exemplary embodiment of an inventive method for compensating for magnetic fields will be explained in more detail with reference to FIG. 5.

A first sensor 11 is used to detect frequency components of the magnetic field between 0 and 20 Hz and to forward them to an analog/digital converter 14. The analog/digital converter is connected to a digital signal processor 15 which is connected to a computer 21 and forms a low-pass filter. The digital signal processor 15 processes the sensor signals. The gain characteristics can be set by means of the computer 21. Following processing, the signal from the first sensor 11 is converted back into an analog signal by means of a digital/analog converter 17.

A second sensor 12 is associated with an analog control path. The signal first of all passes through a high-pass filter 22 so as then to be forwarded to an amplifier 20. The gain of the amplifier 20 is connected to the digital signal processor. Thus, the digital signal processor 15 can be used to control the gain factor. The amplified signal is forwarded to an adder 19, where it is added to the processed signal from the first sensor 11.

An amplifier 23 is used to amplify the compensating signals for the coil 13 again.

The digital signal processor 15 is also connected to the gain of the amplifier 23. Thus, the gain factor of the amplifier 23 can also be controlled by means of the computer 21.

It goes without saying that the subject matter of the invention is not limited to a combination of the aforementioned features, but rather that a person skilled in the art will combine all the features as appropriate.

LIST OF REFERENCE SYMBOLS

1 Sensor
2 Amplifier
3 Helmholtz coil
10 Device for compensating for magnetic fields
11 First sensor
12 Second sensor
13 Helmholtz coil
14 Analog/digital converter
15 Digital signal processor
16 Serial interface
17 Digital/analog converter
18 Multiplexer
19 Adder
20 Amplifier
21 Computer
22 High-pass filter
23 Amplifier

What is claimed is:

1. A device for measuring a magnetic field, comprising:
a first sensor which is active for detecting magnetic fields in a first frequency range and for thereby producing a signal from the first sensor;
a second sensor which is active for detecting magnetic fields in a second frequency range, at least sections of which are above the first frequency range, and for thereby producing a signal from the second sensor; and
an adder for adding i) a first signal that is representative of the signal from the first sensor and ii) a second signal that is representative of the signal from the second sensor.

2. The device for measuring a magnetic field as claimed in claim 1, wherein the device for measuring a magnetic field is active in a bandwidth from 5 Hz to 1 kHz.

3. The device for measuring a magnetic field as claimed in claim 1, further comprising means for digitally processing the signal from the first sensor and/or means for analog processing of the signal from the second sensor.

4. The device for measuring a magnetic field as claimed in claim 1, wherein at least one axis in which the sensors are active are situated essentially parallel.

5. The device for measuring a magnetic field as claimed in claim 1, further comprising a low-pass filter for filtering the signal from the first sensor.

6. The device for measuring a magnetic field as claimed in claim 5, wherein the cutoff frequency of the low-pass filter is below 500 Hz.

7. The device for measuring a magnetic field as claimed in claim 1, further comprising a high-pass filter for filtering the signal from the second sensor.

8. The device for measuring a magnetic field as claimed in claim 7, wherein the cutoff frequency of the high-pass filter is above 5 Hz.

9. The device for measuring a magnetic field as claimed in claim 1, wherein the first sensor is a fluxgate sensor.

10. The device for measuring a magnetic field as claimed in claim 9, wherein the fluxgate sensor can be operated at a chopper frequency which is at least twice as high as the upper end of the bandwidth within which the device for measuring a magnetic field is active.

11. The device for measuring a magnetic field as claimed in claim 10, wherein the chopper frequency is above 50 kHz.

12. The device for measuring a magnetic field as claimed in claim 1, wherein the first and the second sensor are arranged in a housing.

13. A device for compensating for magnetic fields, comprising at least one device for measuring a magnetic field as claimed in claim 1 and at least one compensating coil.

14. The device for compensating for magnetic fields as claimed in claim 13, further comprising a digital signal processor.

15. The device for compensating for magnetic fields as claimed in claim 14 further comprising an A/D converter for producing a digital signal that is representative of the signal from the first sensor, wherein the digital signal processor processes the digital signal.

16. The device for compensating for magnetic fields as claimed in claim 14, wherein the first signal can be forwarded from the digital signal processor to the adder.

17. The device for compensating for magnetic fields as claimed in claim 13, further comprising an amplifier.

18. The device for compensating for magnetic fields as claimed in claim 17, wherein the amplifier is connected to a digital signal processor.

19. The device for compensating for magnetic fields as claimed in claim 13, further comprising a digital signal processor having an interface for connecting a control device.

20. A method for compensating for magnetic fields, comprising the following steps:
    detecting a magnetic field in a first frequency range by means of a first sensor,
    detecting a magnetic field in a second frequency range, at least sections of which are above the first frequency range, by means of a second sensor,
    amplifying the signals from the first sensor and the second sensor, and
    actuating at least one compensating coil with a signal that is based on the amplifying.

21. The method for compensating for magnetic fields as claimed in claim 20, wherein the signals from the first sensor are processed digitally.

22. The method for compensating for magnetic fields as claimed in claim 20, wherein a digital signal processor is used to control and/or regulate at least the gain factor/the gain of the signal from the second sensor.

23. The device for compensating for magnetic fields as claimed in claim 13, wherein a digital signal processor is used to produce a digital low-pass filter for the first sensor.

* * * * *